United States Patent [19]

Komatsu

[11] Patent Number: 4,732,872

[45] Date of Patent: Mar. 22, 1988

[54] METHOD FOR MAKING A BIPOLAR TRANSISTOR AND CAPACITORS USING DOPED POLYCRYSTALLINE SILICON OR METAL SILICIDE

[75] Inventor: Shigeru Komatsu, Kamakura, Japan

[73] Assignee: Tokyo Shibaura Denki Kabushiki Kaisha, Kawasaki, Japan

[21] Appl. No.: 748,711

[22] Filed: Jun. 26, 1985

Related U.S. Application Data

[63] Continuation of Ser. No. 668,188, Nov. 5, 1984, abandoned, which is a continuation of Ser. No. 361,091, Mar. 23, 1982, abandoned.

[30] Foreign Application Priority Data

Mar. 25, 1981 [JP] Japan ................................. 56-43697

[51] Int. Cl.⁴ .......................................... H01L 21/225
[52] U.S. Cl. ...................................... 437/47; 437/160; 437/162; 437/919; 357/51
[58] Field of Search ...................... 29/571, 576 A, 578, 29/589; 148/1.5, 188, DIG. 37, DIG. 30, DIG. 122, DIG. 123; 357/23, 51, 49, 54, 59, 23.6, 71, 71 P, 71 S

[56] References Cited

U.S. PATENT DOCUMENTS

| | | | |
|---|---|---|---|
| 4,001,869 | 1/1977 | Brown | 357/51 |
| 4,040,017 | 8/1977 | Lee | 357/54 X |
| 4,145,803 | 3/1979 | Tasch | 357/59 X |
| 4,282,647 | 8/1981 | Richman | 29/571 |
| 4,377,029 | 3/1983 | Ozawa | 357/51 X |

FOREIGN PATENT DOCUMENTS

| | | | |
|---|---|---|---|
| 0031450 | 8/1981 | European Pat. Off. | |
| 2083346 | 12/1971 | France. | |
| 53-36485 | 4/1978 | Japan | 357/59 R |
| 55-86148 | 6/1980 | Japan | 357/23 C |
| 2019091 | 10/1979 | United Kingdom. | |

OTHER PUBLICATIONS

Ridout, "Methods of Fabricating MOSFET Integrated Circuit with Low Resistivity Interconnection Lines", IBM Tech. Disc. Bull., vol. 23, No. 6, Nov. 1980, pp. 2563–2566.

Dodds et al., "Error Tolerant Adaptive Algorithms for Delta Coding", Conference Record of the 1978 International Conference on Communications, vol. 1, 1978, pp. 8.3.1–8.3.5.

Primary Examiner—Brian E. Hearn
Assistant Examiner—T. N. Quach
Attorney, Agent, or Firm—Finnegan, Henderson, Farabow, Garrett & Dunner

[57] ABSTRACT

The invention provides a method for making a semiconductor device including a bipolar transistor and a capacitor. An oxide film and a silicon nitride film are formed and patterned on a semiconductor substrate. A layer of polycrystalline silicon or of metal silicide containing an impurity is formed between an emitter electrode and an emitter region of the transistor and between an electrode and a thin oxide film of the capacitor. The doped polycrystalline silicon or metal silicide is then patterned to form a barrier layer protecting the oxide film and an intermediate layer acting as a diffusion source to the underlying substrate.

2 Claims, 7 Drawing Figures

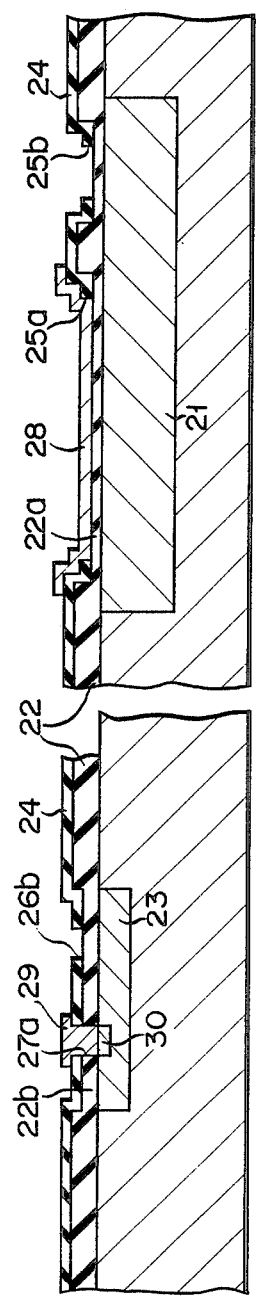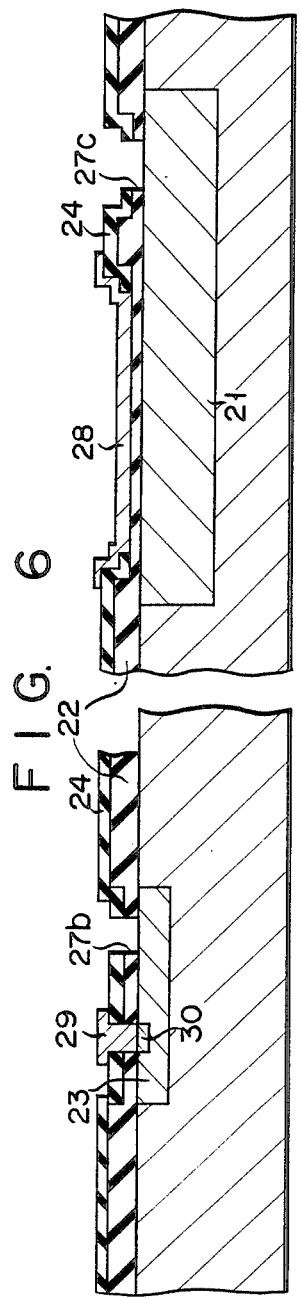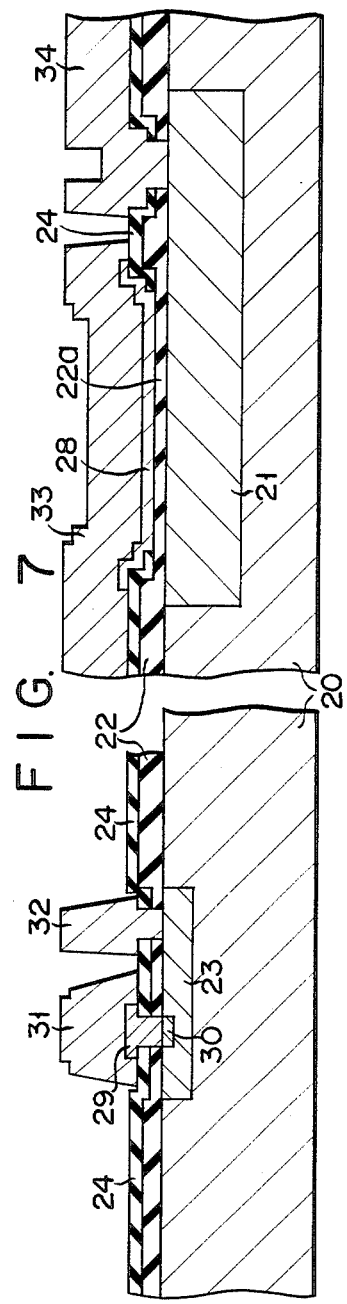

METHOD FOR MAKING A BIPOLAR TRANSISTOR AND CAPACITORS USING DOPED POLYCRYSTALLINE SILICON OR METAL SILICIDE

This application is a continuation of application Ser. No. 668,188, filed Nov. 5, 1984 now abandoned which in turn is a continuation of Ser. No. 361,091, filed Mar. 23, 1982, now abandoned.

BACKGROUND OF THE INVENTION

The present invention relates to a semiconductor device having a MOS capacitor and to a method for manufacturing the same.

In general, high-frequency or high-speed semiconductor devices are manufactured in dimensions as small as fine processing techniques will permit. For this purpose, a self-alignment structure is adopted wherein an opening for diffusion also serves as a contact hole. A composite insulating film of an oxide film and a nitride film is also adopted. FIG. 1 is a cross-sectional view of a semiconductor device of this type. Such a semiconductor device is manufactured as outlined in the following steps.

In a semiconductor substrate 1 of one conductivity type are formed a first impurity diffusion region 2 of any conductivity type and a second impurity diffusion region 3 of the opposite conductivity type to that of substrate 1. An oxide film 4 and a silicon nitride film 5 are formed on the surface of the substrate 1 in the order named, and the composite film formed thereby is patterned. A thin oxide film 4a which is exposed and which is to constitute part of the capacitor is covered by a resist film. Predetermined contact holes are formed. A polycrystalline silicon layer 6 containing a diffusion source is deposited in one of the holes which are connected to the second impurity diffusion region 3. A third impurity diffusion region 7, for example, an emitter region, is formed in the second impurity diffusion region 3 by diffusion of impurity from the polycrystalline silicon layer 6. Thereafter, at least the thin oxide film 4a is covered with a resist film again. A contact hole 8 for a substrate-side electrode 10 of the capacitor as well as a contact hole 9 for an electrode 12 to be connected to the second impurity diffusion region 3 are formed. Finally, the metal electrodes 10, 11, 12 and 13 are formed.

With a conventional semiconductor device of such a structure and a method for manufacturing the same, if there is any defect such as a pin hole in the thin oxide film 4a which determines the capacitance of the MOS capacitor, a capacitor electrode 11 may extend into the first impurity diffusion region 2 (capacitor region) through the oxide film 4a resulting in a short-circuit or dielectric breakdown. The thinner the oxide film 4a is for the purpose of increasing the capacitor capacitance, the more notable this problem becomes. In addition to this, with conventional methods for manufacturing a semiconductor device, it is necessary to cover the oxide film 4a with a resist film in order to form contact holes. This results in even more frequent formation of pin holes in the thin oxide film 4a.

A method for forming an insulating film on a thin oxide film constituting a capacitor is known as a method for manufacturing a semiconductor device having a MOS capacitor without requiring a step for forming the resist film as described above. Thus as shown in FIG. 2, the silicon nitride film 5 including a silicon nitride film 5a remaining on the thin oxide film 4a is used as a resist film in order to form the contact hole 8 for the substrate-side electrode of the capacitor and to form the contact hole 9 for connection to the second impurity diffusion region 3. This method is the same as the method described with reference to FIG. 1, except that the silicon nitride film is used as a resist pattern.

However, with a semiconductor device manufactured in this manner, the insulating film of the MOS capacitor becomes thicker than the thickness of the oxide film 4a by a thickness corresponding to that of the silicon nitride film 5a. The capacitance C of the MOS capacitor is given by:

$$C = \epsilon \times A / l$$

where $\epsilon$ is the dielectric constant, A is the area of the insulating film, and $l$ is the thickness of the insulating film. From this relation, it is apparent that the capacitance of the capacitor is reduced by a value corresponding to the thickness of the silicon nitride film 5a which accounts for the increase in the thickness $l$ of the insulating film. Therefore, the capacitance per unit area of a MOS capacitor having a silicon oxide film and a silicon nitride film both having a thickness of 1,000 Å is $\frac{2}{3}$ that of a MOS capacitor having a similar silicon oxide film of 1,000 Å thickness as an insulating film.

SUMMARY OF THE INVENTION

It is an object of the present invention to provide a semiconductor device which has a high capacitance per unit area and which is capable of preventing shortcircuiting or dielectric breakdown due to defects in a thin insulating film, and to a method for manufacturing the same.

In order to achieve the above object, there is provided according to an aspect of the present invention a semiconductor device wherein in a semiconductor substrate are formed a first region of a predetermined conductivity type, a second region of a conductivity type opposite as a conductivity type of said substrate, and a third region which has a conductivity type same to the conductivity type of said substrate, and which is formed in said second region; a barrier layer of polycrystalline silicon or a metal silicide is formed between an oxide film and a capacitor electrode of a metal in said first region; a substrate-side electrode to be connected to said first region and metal electrodes to be respectively connected to said second and third regions are respectively connected with said first, second and third regions through openings formed in said oxide film and a silicon nitride film formed thereover; an intermediate layer of polycrystalline silicon or a metal silicide is formed between said third region and said metal electrode connected thereto; and said intermediate layer and said barrier layer are both made of a deposition layer of a material selected from the group consisting of polycrystalline silicon and a metal silicide.

According to a second aspect of the present invention, there is also provided a method for manufacturing a semiconductor device comprising the steps of: forming, in a semiconductor substrate, a first region of a predetermined conductivity type and a second region of a conductivity type opposite as the conductivity type of said substrate; forming, on said substrate, an oxide film and a silicon nitride film having a predetermined preliminary opening thereover; forming a first contact hole in said oxide film through said first preliminary opening; forming a layer made of polycrystalline silicon or a metal silicide, and containing an impurity of a conductivity type same to the conductivity type of said substrate in said first contact hole and said first preliminary opening formed in said silicon nitride film above said first region; forming a third region in said substrate by diffusing the impurity into said substrate through said first contact hole; forming second and third contact holes in said oxide film through second preliminary openings formed respectively in parts of said silicon nitride film above said first and second regions; and forming metal electrodes on said layer of polycrystalline silicon or a metal silicide and on said second and third contact holes, respectively.

BRIEF DESCRIPTION OF THE DRAWINGS

FIGS. 3 to 7 are sectional views showing, in sequential order, a method for manufacturing a semiconductor device having a capacitor according to the present invention.

DETAILED DESCRIPTION OF THE PREFERRED EMBODIMENTS

A method for manufacturing a semiconductor device according to the present invention will now be described with reference to FIGS. 3 to 7.

Figure 1:
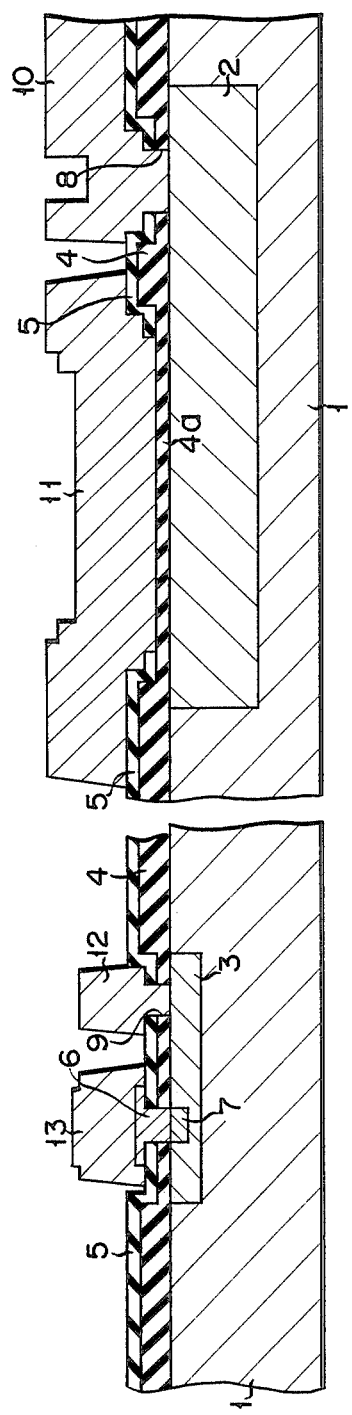
FIG. 1 is a sectional view of a conventional semiconductor device including a capacitor.
Figure 2:
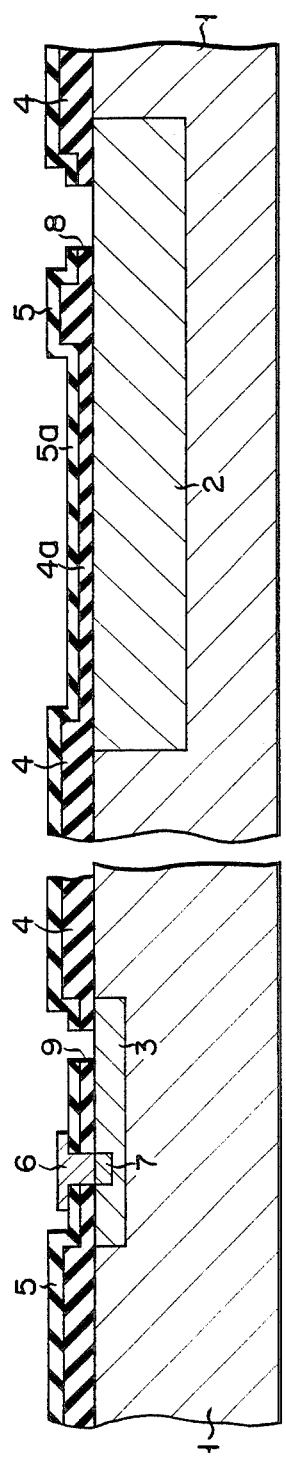
FIG. 2 is a sectional view of a conventional semiconductor device having a silicon nitride film on an oxide film serving as a capacitor.
Figure 3:
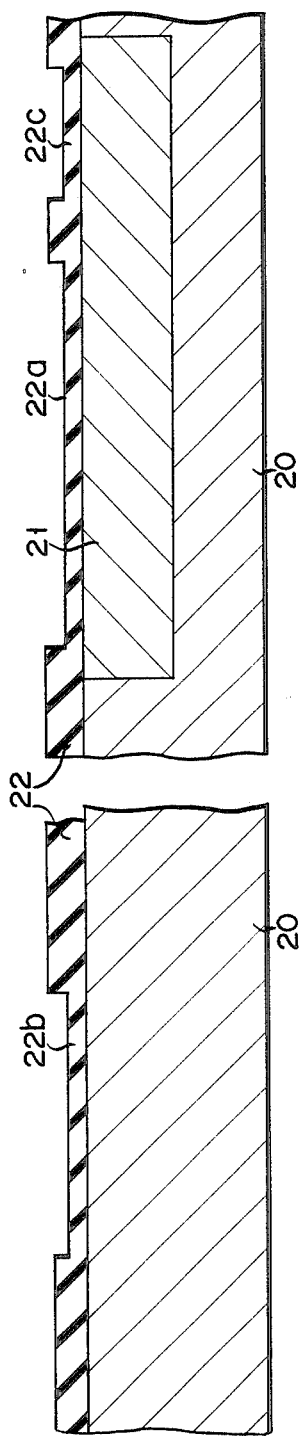

As shown in FIG. 3, an oxide film (not shown) is selectively formed on an n-type semiconductor substrate 20 having a resistivity of 1 to 1.5 $\Omega$ cm. An n-type or p-type impurity is diffused into the semiconductor substrate 20 using the oxide film as a mask. Thus, a first region 21 of low resistivity is formed in the semiconductor substrate 20.

Subsequently, this oxide film is removed and then another oxide film 22 is formed to a thickness of 4,000 to 6,000 Å on the exposed surface of the semiconductor substrate 20 (including the first region 21). Windows are formed in this oxide film 22 by etching in correspondence with a transistor forming region, a MOS capacitor forming region, and a substrate-side electrode region of the capacitor, respectively. Then, an oxide film 22a to become an insulating film of the MOS capacitor and an oxide film 22b for regulating the dose of an impurity for forming a base region to be described later are formed to thicknesses of 500 to 2,000 Å through the windows formed in the step described above. An oxide film 22c is also formed on the substrate-side electrode region of the capacitor.

Figure 4:
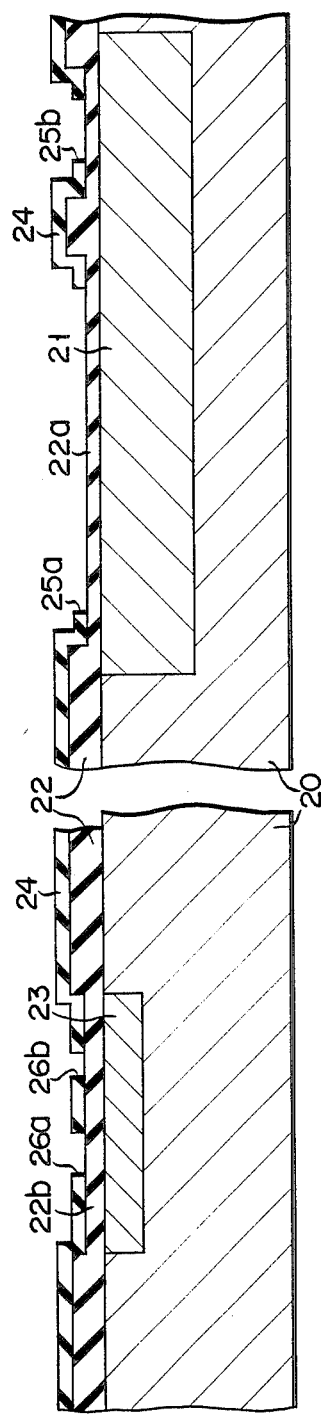

Then, as shown in FIG. 4, an impurity such as boron is ion-implanted into the transistor forming region through the oxide film 22b so as to form a second region 23 to become the base region of a conductivity type the opposite as that of the semiconductor substrate 20. Thereafter, silicon nitride films 24 of a thickness of 500 to 2,000 Å are formed on the oxide films 22, 22a, 22b and 22c. These silicon nitride films 24 are patterned by plasma etching to form above the first region or low resistivity region 21, a first preliminary opening 25a for forming an electrode for the MOS capacitor and a second preliminary opening 25b for forming a substrate-side electrode of the MOS capacitor. Simultaneously, in the silicon nitride film 24 above the second region or the base region 23 are formed a first preliminary opening 26a for forming an emitter region to be described later and a second preliminary opening 26b for forming a base electrode.

As shown in FIG. 5, the preliminary openings 25a, 25b and 26b except the first preliminary opening 26a are covered with a resist film (not shown). The oxide film 22b exposed through the preliminary opening 26a is etched to form a first contact hole 27a in the base region. After removing the resist film, a layer of polycrystalline silicon or a metal silicide containing an impurity such as phosphorus or arsenic for forming an emitter region is formed over the entire area of the structure. This layer of polycrystalline silicon or a metal silicide is selectively etched to leave a barrier layer 28 and an intermediate layer 29 of polycrystalline silicon or a metal silicide only on the oxide film 22a exposed through the first preliminary opening 25a above the first region 21 and on the contact hole 27a. These layers 28 and 29 may alternatively be made by forming a polycrystalline silicon or metal silicide layer which does not contain an impurity, patterning this layer, and ion-implanting an impurity in this layer. Thereafter, annealing for emitter diffusion is performed to diffuse the impurity in the intermediate layer 29 into the second region 23 through the contact hole 27a to form a third region 30 which is to become an emitter region. The third region 30 may alternatively be formed by ion-implantation of an impurity through the contact hole 27a prior to the formation of the layer 29. The metal silicide may be molybdenum silicide or tungsten silicide.

Then, as shown in FIG. 6, the oxide film 22 exposed through the second preliminary openings 25b and 26b formed in the silicon nitride films 24 is removed to form a contact hole 27c for connection to the substrate-side electrode of the MOS capacitor and a contact hole 27b for connection to the base electrode.

Finally, as shown in FIG. 7, there are formed a metal electrode 31 which is connected to the third region or emitter region 30 through the intermediate layer 29 of polycrystalline silicon or a metal silicide, a metal electrode 32 which is connected to the second region or base region 23, a metal electrode 33 for a MOS capacitor formed on the oxide film 22a on the first region 21 through the barrier layer 28 of polycrystalline silicon or a metal silicide, and a substrate-side electrode 34 of the MOS capacitor.

In a semiconductor device manufactured in this manner, the barrier layer 28 of polycrystalline silicon or a metal silicide serves to protect the oxide film 22a as well as to serve as part of the capacitor electrode. Therefore, the insulating film or oxide film 22a can be made very thin so that a MOS capacitor of great capacitance per unit may be obtained. In addition, this barrier layer 28 serves to protect the thin oxide film 22a during the photoetching step using a resist film and to prevent the formation of defects such as pin holes in the oxide film 22a. Therefore, with this MOS capacitor, short-circuiting or dielectric breakdown between the electrode 33 and the first region 21 may be prevented. Since the oxide film 22a of the capacitor is covered by the barrier layer 28 during the formation of the contact hole 27c for connection to the substrate-side electrode of the capacitor, the conventional step for forming a resist film on the oxide film 22a is obviated, resulting in a simpler manufacturing method.

The barrier layer 28 and the intermediate layer 29 are made of one deposition layer of polycrystalline silicon or a metal silicide. Therefore, the barrier layer 28 can be left on the oxide layer of the capacitor while requiring only the same number of steps as the conventional method. Since the thickness of the barrier layer 28 is closely related to that of the intermediate layer, the thickness of both layers is preferably selected to fall within a range of about 500 to 5,000 Å.

The method of the present invention is further advantageous in that the positions of the contact holes 27a, 27b and 27c for connection to the respective electrodes and the position of the capacitor are correctly determined by the positions of the preliminary openings 25a, 25b, 26a, and 26b.

The present invention has been described with reference to a case of a method for manufacturing a semiconductor device comprising a bipolar transistor having a MOS capacitor. However, the present invention is similarly applicable to methods for manufacturing various other types of semiconductor devices wherein the barrier layer 28 as part of the electrode for the capacitor can be formed during the step of forming the intermediate layer 29.

What is claimed is:

1. A method for manufacturing a semiconductor device, comprising the steps of:

forming a semiconductor substrate of a first conductivity type having a first impurity region and a second impurity region of a second conductivity type;

forming an oxide film on said semiconductor substrate;

forming on said oxide film a silicon nitride film having a first opening above said first impurity region and a second opening above said second impurity region;

forming a contact hole in said oxide film through said second opening;

forming a conductive layer containing an impurity of the first conductivity type, and made of a material selected from the group consisting of polycrystalline silicon and metal silicide, on said silicon nitride film and exposed regions of said oxide film and said substrate;

selectivity removing said conductive layer to leave a first portion on said oxide film and a second portion on said substrate, said first portion acting as a barrier layer for protecting said oxide film, and said second portion acting as an intermediate layer;

forming a third impurity region of the first conductivity type in said second impurity region by diffusing the impurity of said second portion into said second impurity region; and forming metal electrodes connected to said barrier layer and said intermediate layer.

2. A method according to claim 1, wherein said conductive layer has a thickness of 500 to 5,000 Å.

* * * * *